United States Patent [19]
Oltean

[11] Patent Number: 6,044,113
[45] Date of Patent: Mar. 28, 2000

[54] DIGITAL PULSE WIDTH MODULATOR

[75] Inventor: Ioan T. Oltean, Sunnyvale, Calif.

[73] Assignee: VISX, Inc., Santa Clara, Calif.

[21] Appl. No.: 09/251,317

[22] Filed: Feb. 17, 1999

[51] Int. Cl.[7] ................ H03K 7/08; H03K 9/00
[52] U.S. Cl. ............ 375/238; 332/109; 329/311
[58] Field of Search ................. 375/238, 377; 329/311, 312; 332/109, 106; 318/559, 603, 811

[56] References Cited

U.S. PATENT DOCUMENTS

| | | | |
|---|---|---|---|
| 4,489,267 | 12/1984 | Saar et al. ................... | 318/811 |
| 4,890,214 | 12/1989 | Yamamoto .................. | 363/49 |
| 5,361,290 | 11/1994 | Akiyama .................... | 377/47 |
| 5,623,518 | 4/1997 | Pfiffner ...................... | 375/278 |
| 6,005,377 | 12/1999 | Chen et al. .................. | 323/283 |

Primary Examiner—Chi H. Pham
Assistant Examiner—Khai Tran
Attorney, Agent, or Firm—James P. Cleary; Townsend and Townsend and Crew LLP

[57] ABSTRACT

A digital pulse width modulation circuit and method includes a first pulse width clock signal modulated by a second pulse width clock signal that represents a converted analog voltage input. The first and second pulse width signals are provided to a counter that counts to a predetermined gate count, wherein an output pulse width signal is provided that is in proportion to the analog voltage input.

15 Claims, 3 Drawing Sheets

DIGITAL PULSE WIDTH MODULATOR

BACKGROUND OF THE INVENTION

The present invention relates to data transmission and more specifically to a circuit and method for producing a linear and stable pulse width modulation signal.

In data transmission systems, modulation is the process of encoding analog or digital input data signals onto a carrier signal of a certain frequency $f_c$. The frequency of the carrier signal is carefully chosen for its compatibility with the transmission medium on which it is sent. The modulated signal is decoded at a receiver to restore the input data signals. An example of an input data signal is a control signal that is modulated by an input data signal and transmitted to an electronic device where the control signal is restored.

One modulation technique is pulse width modulation (PWM) in which a value of an input sample is used to modulate the duration of pulses in an output signal. The carrier signal can be analog, however digital PWM provides greater accuracy and has largely replaced analog PWM in modern electronic applications. In digital PWM, a digital input is counted and used to generate a train of pulses of fixed frequency, with the pulse widths being proportional to the digital input count. A pulse width, or pulse duration, defines a part of what is known as a duty cycle, which is a ratio of a pulse's duration in proportion to the total period.

FIG. 1 is a simplified diagram of a conventional digital pulse width modulation scheme 100 that uses one clock and two counters. A clock source 102 provides a pulse width carrier signal having a fixed frequency $f_c$. The clock source 102 is provided to two counters 106(a) and (b) simultaneously. A microprocessor or microcontroller 104 loads each counter 106(a) and 106(b) with counts N1 and N, respectively, where N is greater than N1. Counters 106(a) and 106(b) perform a modulo-N count of the N1 and N pulses at each clock pulse $f_c$. At each N1th count flip-flop 108 is set, and at each Nth count flip-flop 108 is reset, providing an output pulse signal.

FIG. 2 illustrates a digital PWM output pulse signal. With reference also to FIG. 1, at a count of N1, flip-flop 108 is set, and a pulse signal period begins at step 202. At a count of N, flip-flop 108 is reset, and the pulse signal ends at step 204. Again, at a count of N1, the next period begins at step 206, and so on. In FIG. 2, T represents one period of pulse signal 200, and the duty cycle of signal 200 is represented as $t_1/T$, which is directly proportional to counts N1 and N. Thus, by changing the value of N1 and N, the duty cycle of signal 200 may be varied.

Most conventional digital PWM circuits do not provide a precise or stable enough duty cycle for more complex electronic device applications. One source of error is having two counters provide the digital input counts on which the duty cycle is based. A second source of error is clock variations carrying over to the output signal. What is needed is digital pulse width modulation that provides a stable and precise duty cycle suitable for providing control to complex electronic devices.

SUMMARY OF THE INVENTION

It is therefore an object of the present invention to provide linear and stable pulse width modulation.

It is another object of the present invention to provide pulse width modulation using voltage-to-frequency conversion and digital logic.

Finally, it is another object of the present invention to provide pulse width modulation having a output that is very linear with respect to a variable input.

Briefly, the invention comprises a digital pulse width modulation circuit having a first clock to provide a first pulse width signal having a fixed frequency, a second clock to provide a second pulse width signal having a second frequency proportional to the fixed frequency, means for producing a first count based on the fixed frequency and for producing a second count based on the second frequency, a counter to continually accumulate the first and second counts, and upon a predetermined final count provide an output pulse width signal based on the final count, from which a means generates a waveform signal having a duty cycle that is a proportion of the second count to the final count.

In one embodiment of the present invention, the second clock comprises a voltage to frequency converter, coupled to the first pulse width signal, and configured to provide a second pulse width signal based on a variable voltage input, where the second pulse width signal has a second frequency proportional to the fixed frequency.

In another embodiment of the present invention, a frequency divider is coupled to the first pulse width signal and configured to provide a square wave signal having a period proportional to the first pulse width signal, and the square wave signal transitions between high and low states. Coupled to the frequency divider and receiving the square wave signal is a circuit for producing a first count signal based on the fixed frequency and one of the states, and for producing a second count signal based on the second frequency and the other state.

For a further understanding of the nature and advantages of the invention, reference should be made to the following description taken in conjunction with the accompanying drawings.

BRIEF DESCRIPTION OF THE DRAWINGS

The invention will be described with respect to the particular embodiments thereof and references will be made to the drawings, in which.

DESCRIPTION OF THE SPECIFIC EMBODIMENTS

Figure 1:
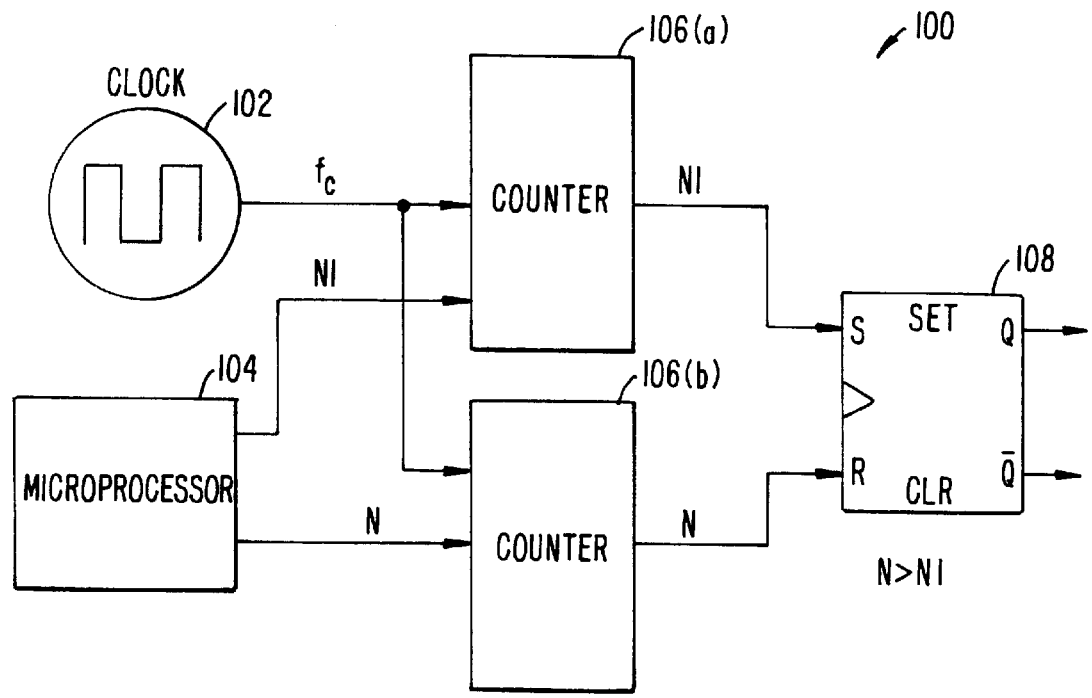
FIG. 1 is a simplified diagram of a conventional digital pulse width modulation scheme.
Figure 2:
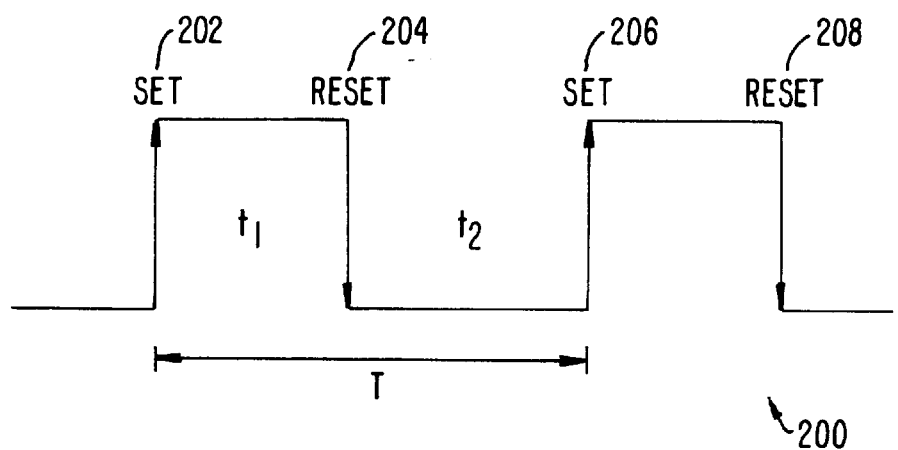
FIG. 2 illustrates a digital pulse width modulation output signal.
Figure 3:
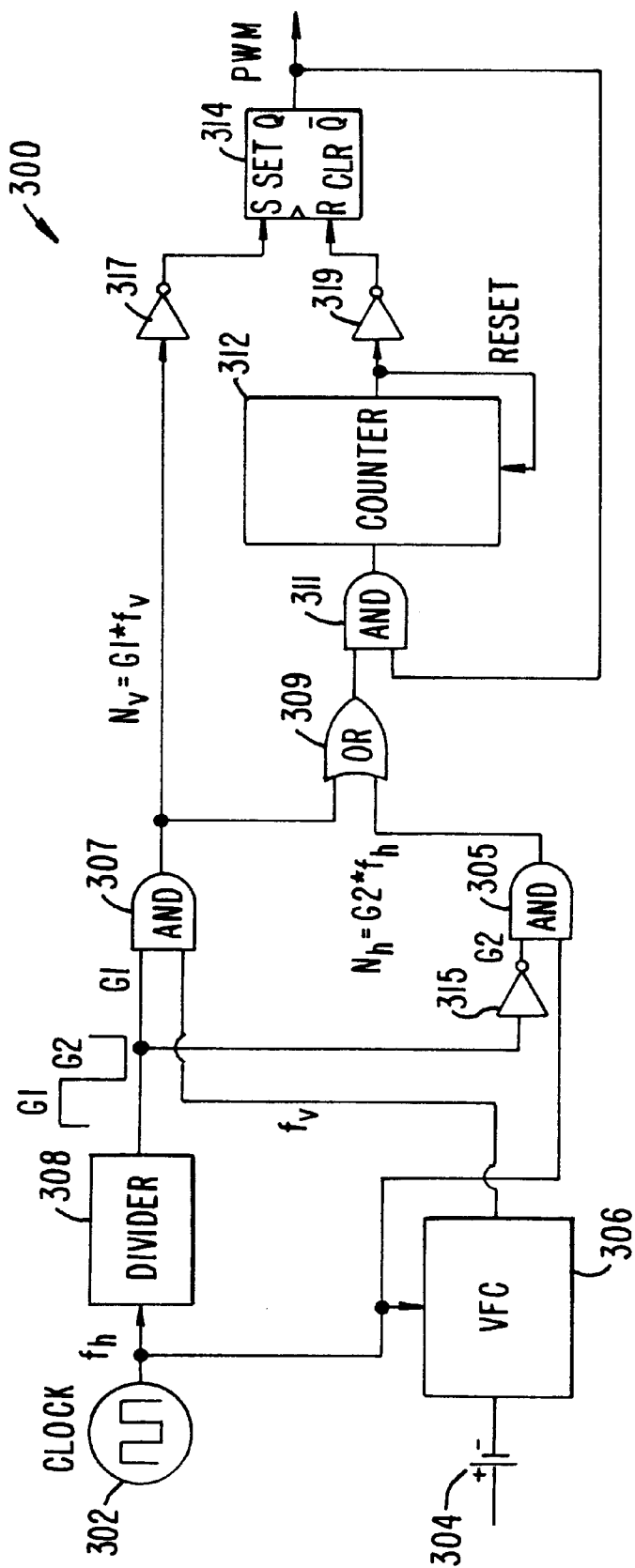
FIG. 3 is a circuit diagram of one embodiment of a digital pulse width modulation circuit according to the invention.

FIG. 3 shows one embodiment of a digital pulse width modulation circuit according to the invention. A carrier frequency is provided by a clock 302 that outputs a first pulse width signal having a fixed frequency, designated here as $f_h$. In a preferred embodiment, the first pulse width signal is a high frequency clock signal, and $f_h$ is a frequency greater than 1 MHz, and is suitable for transmission over an optical cable. In a specific preferred embodiment, frequency $f_h$ is at around 1.536 MHz. The first pulse width signal is provided as a reference clock to a voltage to frequency converter (VFC) 306, which receives a variable analog input signal 304, that is a voltage signal, ranging from 0.0 V to 10 V in the preferred embodiment. Several examples of a commercially available VFC that may be suitably used in the present invention are the VC100 Voltage to Frequency Converter by Burr-Brown, or the AD652 Voltage to Frequency Converter by Analog Devices. However, other VFCs could be used and voltage signals having a voltage beyond the preferred range could also be used. The VFC 306 provides a second pulse width signal $f_v$ based on the variable analog input signal 304, that is proportionally lower in frequency than the first pulse width signal $f_h$.

A divider 308 receives the first pulse width signal $f_h$ and is configured to divide it into a square wave signal. The divider is preferably a 512-count gate counter and the square wave signal is preferably a 3 kHz square wave based on a 1.536 MHz clock input. The square wave signal transitions between a high signal state G1 and a low signal state G2 which provides a first and second gate signal, respectively.

An AND-gate 305 or similar combinational circuit, combines signal state G2 with the first pulse width signal $f_h$ to provide a first count signal $N_h$. Likewise, AND-gate 307 combines signal state G1 with the second pulse width signal $f_v$ to provide a second count signal $N_v$. An OR-gate 309 or similar logic circuitry, receives both first and second count signals $N_h$ and $N_v$, which are mutually exclusive, and outputs whichever signal is then currently "on". The second count signal $N_v$ is inverted by an inverter 317 and provided to a flip-flop 314 as a "SET" signal, causing the flip-flip 314 to output a rising edge of a waveform. The output of flip-flop 314 is fed back to an AND-gate 311, which combines the output of OR-gate 309, which could be $N_h$ or $N_v$. The output of AND-gate 311 is a count signal provided to a counter 312.

Counter 312 accumulates the counts $N_v$ and $N_f$ until it achieves a predetermined final count, the predetermined final count indicating a "FULL" state. In the preferred embodiment, the predetermined final count is 128. Thus, counter 312 will accumulate counts $N_v$ and $N_f$ until the accumulated total reaches a FULL state at a count of 128. Upon achieving the predetermined final count, the counter 312 outputs a final count signal that is inverted by an inverter 319, and provided as the "RESET" signal to the flip-flop 314.

The duty cycle, $D_t$, of the waveform signal output of circuit 300 can be expressed as:

$$D_t = \frac{3}{4} - \frac{V_{in}}{40}$$

Thus, where the input analog voltage signal $V_{in}$ is between 0 and 10 volts, $D_t$ will range from ¾ to ½ respectively, representing a pulse width modulated waveform signal output duty cycle ranging between 50 and 75 percent. The duty cycle provided by the circuit described above according to an embodiment of the present invention is highly linear with respect to the variable input voltage, is precise, and is insensitive to variations in the clock frequency.

The duty cycle, $D_t$, can be shown mathematically. The PWM signal generated by the present invention has two levels:

1) High level, which starts with the first $N_v$ pulse:

$$T_{P1} = \left( N_v \cdot \frac{1}{f_v} + N_{suppl} \cdot \frac{1}{f_h} \right) \quad (1)$$

Where $N_v + N_{suppl}$ are equal to a count of 128 in a preferred embodiment. Which, by substituting $N_v + N_{suppl} = 128$ into equation (1) yields:

$$T_{P1} = \frac{N_v}{f_v} + \frac{128 - N_v}{f_h} \quad (2)$$

$$T_{P1} = \frac{128}{f_h} + N_v \left( \frac{1}{f_v} - \frac{1}{f_h} \right) \quad (3)$$

2) Low level, which can be expressed as:

$$T_{P2} = T_g - T_{P1} \quad (4)$$

Where Tg is the period of the square wave signal output from divider 308 in FIG. 3. With this information, the duty cycle for the present invention may be determined as:

$$D_t = \frac{T_{P1}}{T_g} \quad (5)$$

which yields:

$$D_t = \frac{\frac{128}{f_h} + N_v \left( \frac{1}{f_v} - \frac{1}{f_h} \right)}{\frac{512}{f_h}} \quad (6)$$

Next, Nv may be solved for with $N_v = T_{g1} \cdot f_v$, where $T_{g1}$ is the high state portion of the square wave signal $T_g$, and where:

$$Nv = \frac{T_g}{2} \cdot \frac{V_{in}}{20v} \cdot f_h = \frac{256 V_{in}}{20v} \quad (7)$$

Where $V_{in}$ and its denominator are in volts. Inserting equation (7) into equation (6) yields:

$$D_t = \frac{1}{4} + \frac{\frac{256 V_{in}}{20v}}{512} \cdot \left( \frac{f_h}{f_v} - 1 \right) \quad (8)$$

$$D_t = \frac{1}{4} + \frac{V_{in}}{20} \cdot \left( \frac{20}{V_{in}} - 1 \right) \quad (9)$$

And, finally:

$$D_t = \frac{1}{4} + \frac{1}{2} - \frac{V_{in}}{40} = \frac{3}{4} - \frac{V_{in}}{40} \quad (10)$$

Thus, when $V_{in} = 0$ volts, the duty cycle $D_t$ is ¾, and when $V_{in} = 10$ volts, the duty cycle $D_t$ is ½.

Figure 4:
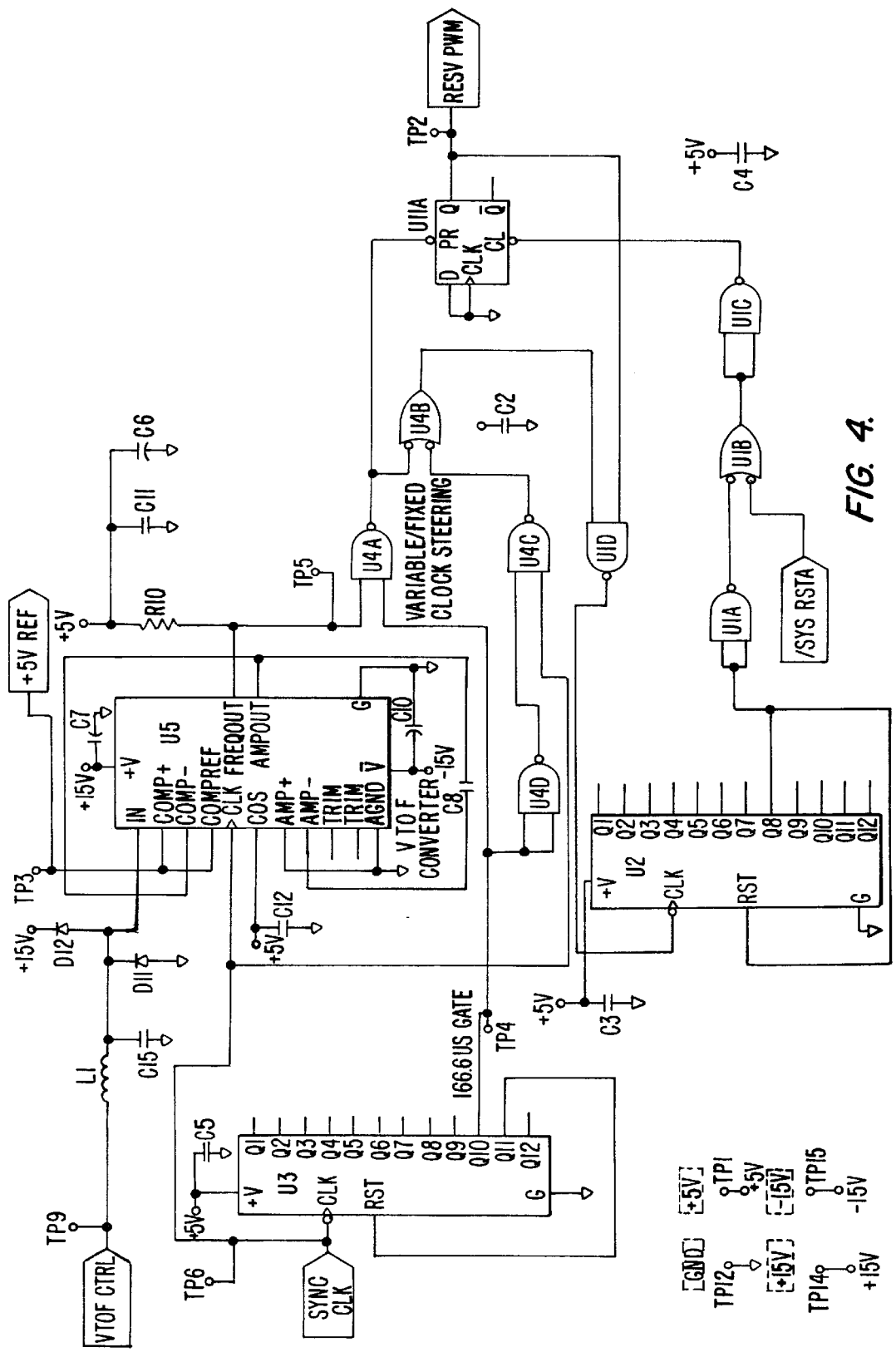
FIG. 4 is a circuit diagram of an alternate embodiment of a digital pulse width modulation circuit according to the invention.

FIG. 4 illustrates a specific embodiment of the present invention showing a digital PWM according to the invention in greater detail. With reference to FIG. 4, there is shown a digital pulse width modulation circuit 400 having a clock, a voltage to frequency converter, a divider, a counter, and a flip-flop. Also illustrated in FIG. 4 are various electronic devices coupled with the circuit 400 to modify and shape the signals being provided throughout the circuit.

While the invention has been particularly shown and described with references to the preferred embodiments thereof, it will be understood by those skilled in the art that changes in form and detail made be made therein without departing from the spirit and scope of the invention. Given the above disclosure of general concepts and specific embodiments, the scope of the protection sought is defining by the following:

What is claimed is:

1. A digital pulse width modulation circuit, comprising:
    a first clock to provide a first pulse width signal having a fixed frequency;
    a second clock to provide a second pulse width signal having a second frequency proportional to said fixed frequency;
    means for producing a first count based on said fixed frequency and for producing a second count based on said second frequency;
    a counter to continually accumulate said first and second counts, and upon a predetermined final count to provide an output pulse width signal based on said final count; and
    means, responsive to said second count and said final count, for generating a waveform signal having a duty cycle; wherein said duty cycle is a proportion of said second count to said final count.

2. The circuit of claim 1 wherein said second clock is an analog to digital converter coupled to said first pulse width signal, and configured to provide said second pulse width signal based on a variable analog input.

3. The circuit of claim 2 wherein said converter is a voltage-to-frequency converter, and said variable analog input is a voltage signal.

4. The circuit of claim 1 wherein said producing means includes a divider coupled to said first pulse width signal, and configured to provide a square wave signal based on said first pulse width signal, said square wave signal transitioning between high and low states.

5. The circuit of claim 4 wherein said producing means further includes a circuit for summing said fixed frequency and one of said states to produce said first count, and for summing said second frequency and the other of said states to produce said second count.

6. The circuit of claim 1 wherein said generating means comprises a set/reset flip flop.

7. The circuit of claim 1 wherein said duty cycle is within a range of 50 to 75 percent.

8. The circuit of claim 3 wherein said voltage signal is between 0 and 10 volts.

9. The circuit of claim 4 wherein said divider divides said first pulse width signal by 512.

10. The circuit of claim 1 wherein said first pulse width signal is a high frequency clock signal having a frequency range of approximately 10 kHz to 1.536 MHz.

11. A digital pulse width modulation circuit, comprising:
    a clock to provide a first pulse width signal having a fixed frequency;
    a voltage to frequency converter, coupled to said first pulse width signal, and configured to provide a second pulse width signal based on a variable voltage input, said second pulse width signal having a second frequency proportional to said fixed frequency;
    a frequency divider, coupled to said first pulse width signal and configured to provide a square wave signal having a period proportional to said first pulse width signal, said square wave signal transitioning between high and low states;
    a circuit for producing a first count signal based on said fixed frequency and one of said states, and for producing a second count signal based on said second frequency and the other of said states;
    a counter that accumulates said first and second count signals until a predetermined final count is achieved, wherein said counter generates a final count signal; and
    a flip-flop, responsive to said second count signal and said final count signal, for providing a waveform signal having a duty cycle as a proportion of said second count signal to said final count signal.

12. A method of generating a digital pulse width modulation signal, comprising the steps of:
    providing a first pulse width signal having a fixed frequency;
    converting a variable analog input into a second pulse width signal having a second frequency proportional to said fixed frequency;
    producing a first count based on said fixed frequency and a second count based on said second frequency;
    counting said first and second counts;
    upon a predetermined final count, generating an output pulse width signal based on said final count; and
    generating a waveform signal having a duty cycle, wherein said duty cycle is a proportion of said second count to said final count.

13. The method of claim 12 wherein said duty cycle is within a range of 50 to 75 percent.

14. The method of claim 12 wherein said producing step further comprises the steps of:
    dividing said first pulse width signal by a fixed count;
    generating a square wave signal having a period proportional to said first pulse width signal, said square wave signal transitioning between high and low states; and
    producing said first count signal based on said fixed frequency and one of said states, and said second count signal based on said second frequency and the other of said states.

15. The method of claim 12 wherein said variable analog input is a voltage between a range of 0 to 10 volts.

* * * * *